US010198371B2

(12) United States Patent
Noda

(10) Patent No.: US 10,198,371 B2
(45) Date of Patent: Feb. 5, 2019

(54) APPARATUSES AND METHODS FOR TRANSFERRING DATA FROM MEMORY ON A DATA PATH

(71) Applicant: Micron Technology, Inc., Boise, ID (US)

(72) Inventor: Hiromasa Noda, Tokyo (JP)

(73) Assignee: Micron Technology, Inc., Boise, ID (US)

(*) Notice: Subject to any disclaimer, the term of this patent is extended or adjusted under 35 U.S.C. 154(b) by 557 days.

(21) Appl. No.: 14/839,812

(22) Filed: Aug. 28, 2015

(65) Prior Publication Data
US 2017/0060789 A1    Mar. 2, 2017

(51) Int. Cl.
*G06F 13/00*    (2006.01)
*G06F 13/16*    (2006.01)
*G06F 13/40*    (2006.01)

(52) U.S. Cl.
CPC ...... *G06F 13/1673* (2013.01); *G06F 13/4022* (2013.01); *G06F 13/4068* (2013.01)

(58) Field of Classification Search
CPC .... G06F 3/0611; G06F 13/4022; G06F 3/061; G06F 12/00; G06F 12/02; G06F 13/1657; G06F 13/1668; G06F 13/1673; G06F 13/4068
See application file for complete search history.

(56) References Cited

U.S. PATENT DOCUMENTS

2007/0162685 A1*  7/2007  Suh ............... G11C 11/4096
                                              711/100
2013/0019044 A1    1/2013  Kaiwa et al.

* cited by examiner

*Primary Examiner* — Idriss N Alrobaye
*Assistant Examiner* — Richard B Franklin
(74) *Attorney, Agent, or Firm* — Dorsey & Whitney LLP

(57) ABSTRACT

Apparatuses and methods for transferring data from memory on a data path are described. An example apparatus includes: one or more data terminals; a plurality of memory banks, one of the plurality of memory banks being selected responsive, at least in part, to a bank address; and a data path including a plurality of data path routes and a plurality of switching buffers on the plurality of data path routes. The plurality of switching buffers are arranged such that one or more of the plurality of switching buffers are selected responsive, at least in part, to the bank address and activates one of the plurality of data path routes.

19 Claims, 14 Drawing Sheets

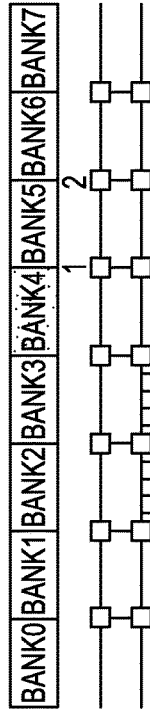
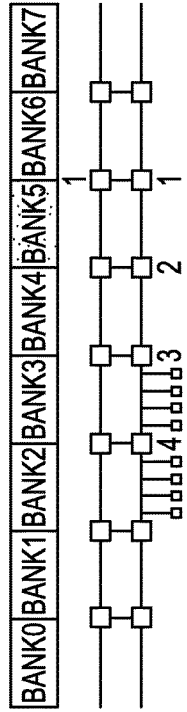
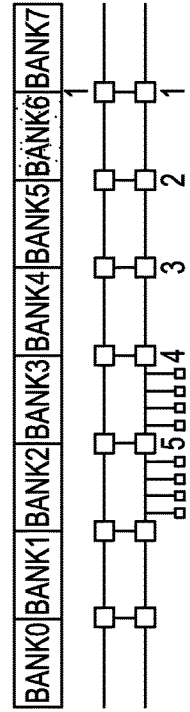
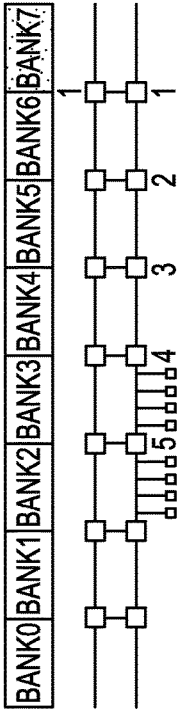
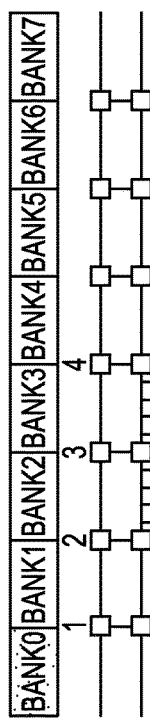
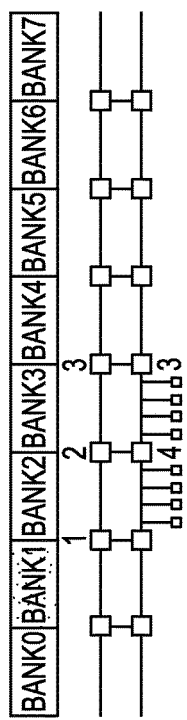
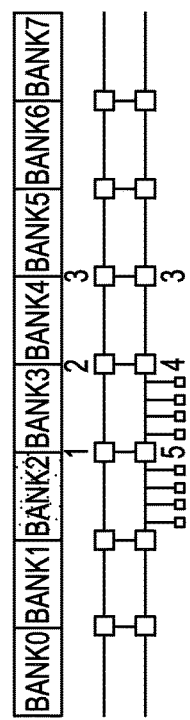

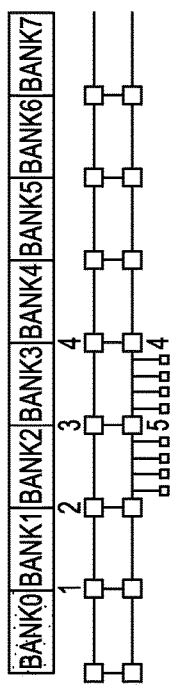
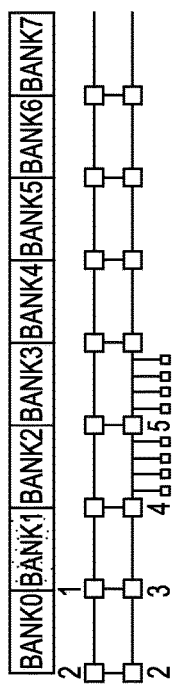
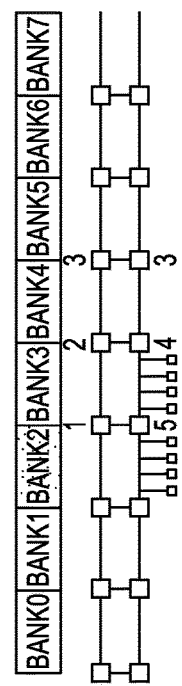
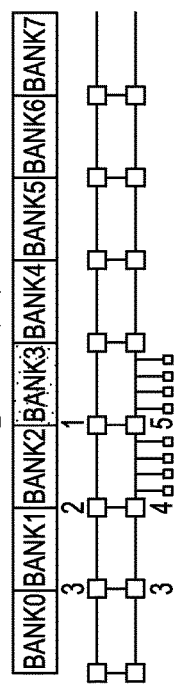
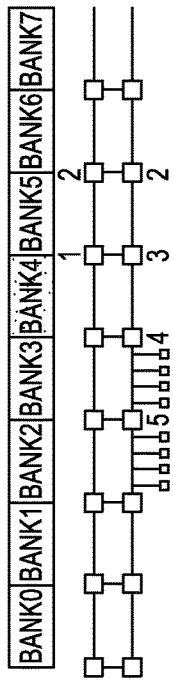
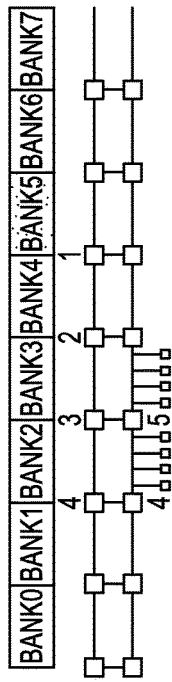
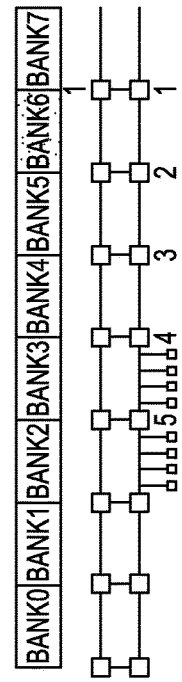
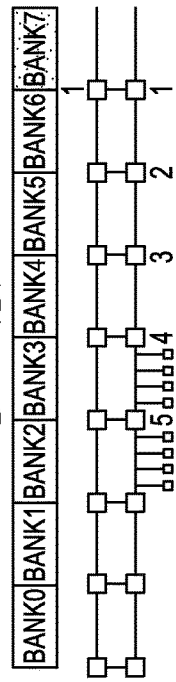

APPARATUSES AND METHODS FOR TRANSFERRING DATA FROM MEMORY ON A DATA PATH

BACKGROUND

In a semiconductor memory device, a plurality of data buses is used for memory access. One way of achieving fast memory access is by increasing a data transfer speed in the semiconductor memory device, which may be achieved by increasing a number of buses. For example, in a typical Double Data Rate Fourth generation synchronous dynamic random-access memory (DDR4 SDRAM) product, the data transfer speed has been increased by implementing at least 8 bit×8=64 data lines. The 64 data lines have an 8 bit prefetch configuration and data buses of either 8 bit input/output lines (IO×8) with 16 banks configuration or 16 bit Input/Output lines (IO×16) with 8 banks configuration and data bus inversion (DBI) functionality. However, the increase the number of buses tends to result in a larger memory chip size because the plurality of data buses is aligned with intervals in a chip layout in order to avoid undesired noise effects from adjacent buses. Consequently, the increased number of buses with more intervals results in a larger space in the chip layout.

In recent years, in view of increasing a higher data transfer rate of data, technical endeavors need to be made. For example, US 2013/0019044 A1 focuses on arranging bus interface circuits densely in an area in order to accommodate high speed memory data access.

BRIEF DESCRIPTION OF THE DRAWINGS

FIGS. 4(a)-(h) include schematic diagrams indicative of the first embodiment of configuration of data buses transferring data from memory banks to data terminals with switching buffers.

FIGS. 8(a)-(h) and 9(a)-(d) include schematic diagrams indicative of a third embodiment of configuration of data buses transferring data from memory banks to data terminals with switching buffers.

DETAILED DESCRIPTION OF PREFERRED EMBODIMENTS

In semiconductor devices of recent years, high speed of memory access has been strongly demanded as well as reduction in chip size. To achieve higher speed memory access, a memory may include a plurality of data buses between memory banks and data input/output terminals (DQ terminals). Because higher speed memory access typically increases a number of data buses resulting in a larger memory chip size, achieving both an increase in the speed of memory accesses and reducing chip size has been difficult due to the fact that these two goals are typically in a trade-off relationship.

One possible approach to achieve higher speed memory access may be controlling delays, such as propagation delays due to switching buffers, etc., timing of data transfer, etc. Therefore, minimizing differences in data propagation delay among memory banks by coordinating distances between the memory banks and the corresponding data input/output terminals (DQ pads) could improve data access time.

Focusing on this point, in the semiconductor device according to the present embodiment, propagation delays due to the distances of data path routes on a data path between the memory banks and the corresponding data input/output terminals (DQ pads) and switching buffers on the data path routes can be controlled by properly configuring the data path routes between each memory bank to each corresponding data input/output pads based on each bank address and a read or write command typically included in a column command signal.

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
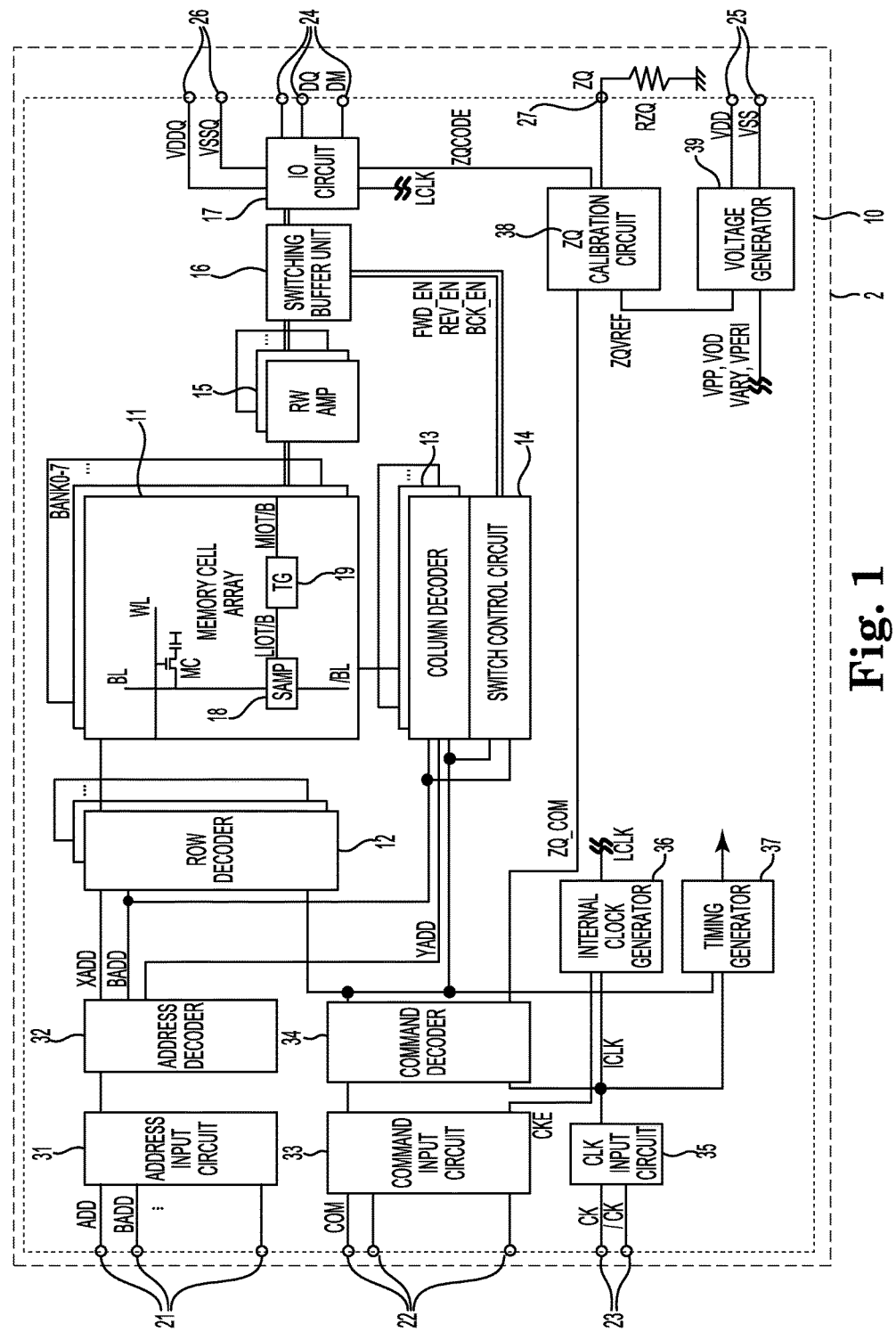
FIG. 1 is a block diagram indicative of an embodiment of an overall configuration of a semiconductor device.

FIG. 1 illustrates a block diagram for an overall configuration of a semiconductor device 10 including a switch control circuit 14 and a switching buffer unit 16, according to an embodiment of the present invention. The semiconductor device 10 may be a DDR4 SDRAM integrated into a single semiconductor chip, for example. The semiconductor device 10 is mounted on an external substrate 2 that is a memory module substrate, a mother board or the like. The external substrate 2 employs an external resistor $R_{ZQ}$ that is connected to a calibration terminal ZQ 27 of the semiconductor device 10. The external resistor $R_{ZQ}$ is a reference impedance of a ZQ calibration circuit 38. In the present embodiment, the external resistor $R_{ZQ}$ is coupled to a ground potential.

As shown in FIG. 1, the semiconductor device 10 includes a memory cell array 11. The memory cell array 11 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13. Sense amplifiers 18 are located for their corresponding bit lines BL and connected to local I/O line pairs LIOT/B. Local I/O line pairs LIOT/B are connected to main I/O line pairs MIOT/B via transfer gates TG 19 which function as switches.

The semiconductor device 10 employs a plurality of external terminals that include address terminals 21, command terminals 22, clock terminals 23, data terminals 24, power supply terminals 25 and 26, and the calibration terminal ZQ 27.

The address terminals 21 are supplied with an address signal ADD and a bank address signal BADD from outside. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12, and a decoded column address signal YADD to the column decoder 13. The address decoder 32 also receives the bank address signal BADD and supplies the bank address signal BADD to and the row decoder 12, the column decoder 13 and a switch control circuit 14.

The command terminals 22 are supplied with a command signal COM from outside. The command signal COM input to the command terminals 21 is input to a command decoder 34 via the command input circuit 33. The command decoder 34 decodes the command signal COM to generate various internal commands that include a row command signal to select a word line and a column command signal, such as a read command or a write command, to select a bit line, and a calibration signal ZQC to the ZQ calibration circuit 38.

Accordingly, when the read command is issued and a row address and a column address are timely supplied with the read command, read data is read from a memory cell MC in the memory cell array 11 designated by these row address and column address. The read data DQ is output to outside from the data terminals 24 via a read/write amplifier 15, the switching buffer unit 16 and an input/output circuit 17. Similarly, when the write command is issued and a row address and a column address are timely supplied with this command, and then write data DQ is supplied to the data terminals 24, the write data DQ is supplied via the input/output circuit 17, the switching buffer unit 16 and the read/write amplifier 15 to the memory cell array 11 and written in the memory cell MC designated by the row address and the column address.

The switch control circuit 14 is a circuit in which switch control signals including "Fwd_en", "Rev_en" and "Bck_en" are generated responsive to the bank address signal BADD and the column command signal. Once the switch control circuit 14 receives the bank address signal BADD and the column command signal indicative of a read command is received, the switch control circuit generates these switch control signals at respective timings such that switch control signals are provided to be overlapped with each other. These switch control signals are provided to the switching buffer unit 16 and used in activating one data path route among a plurality of data path routes. The switching buffer unit 16 includes a data path. The data path includes data busses and further includes switching buffer circuits. The data busses include data bus segments coupled to the switching buffer circuits. The data path is coupled to data terminals and a plurality of memory banks. The switching buffer circuits drive data from one side associated with a first data bus segment where the data is currently transmitted to another side associated with a second data bus segment where the data is to be transmitted next based on the received switch control signals, such as "Fwd_en", "Rev_en" and "Bck_en", indicative of data flow directions to be controlled, and stop driving data once the data is transmitted to the other side. The details of the switching buffer unit 16 are described later.

Turning to the explanation of the external terminals included in the semiconductor device 10, the clock terminals 23 are supplied with external clock signals CK and/CK, respectively. These external clock signals CK and/CK are complementary to each other and are supplied to a clock input circuit 35. The clock input circuit 35 receives the external clock signals CK and/CK to generate an internal clock signal ICLK. The internal clock signal ICLK is supplied to an internal clock generator 36 and thus a phase controlled internal clock signal LCLK is generated based on the received internal clock signal ICLK and a clock enable signal CKE from the command input circuit 33. Although not limited thereto, a DLL circuit can be used as the internal clock generator 36. The phase controlled internal clock signal LCLK is supplied to the input/output circuit 17 and is used as a timing signal for determining an output timing of the read data DQ. The internal clock signal ICLK is also supplied to a timing generator 37 and thus various internal clock signals can be generated.

The power supply terminals 25 are supplied with power supply potentials VDD and VSS. These power supply potentials VDD and VSS are supplied to an internal voltage generating circuit 39. The internal power supply generating circuit 39 generates various internal potentials VPP, VOD, VARY, VPERI, and the like and a reference potential ZQVREF based on the power supply potentials VDD and VSS. The internal potential VPP is mainly used in the row decoder 12, the internal potentials VOD and VARY are mainly used in the sense amplifiers 18 included in the memory cell array 11, and the internal potential VPERI is used in many other circuit blocks. The reference potential ZQVREF is used in the ZQ calibration circuit 38.

The power supply terminals 26 are supplied with power supply potentials VDDQ and VSSQ. These power supply potentials VDDQ and VSSQ are supplied to the input/output circuit 17. The power supply potentials VDDQ and VSSQ are the same potentials as the power supply potentials VDD and VSS that are supplied to the power supply terminals 25, respectively. However, the dedicated power supply potentials VDDQ and VSSQ are used for the input/output circuit 17 so that power supply noise generated by the input/output circuit 17 does not propagate to the other circuit blocks.

The calibration terminal ZQ is connected to the calibration circuit 38. The calibration circuit 38 performs a calibration operation with reference to an impedance of an external resistance Re and the reference potential ZQVREF, when activated by the calibration signal ZQC. An impedance code ZQCODE obtained by the calibration operation is supplied to the input/output circuit 17, and thus an impedance of an output buffer (not shown) included in the input/output circuit 17 is specified.

Figure 2:
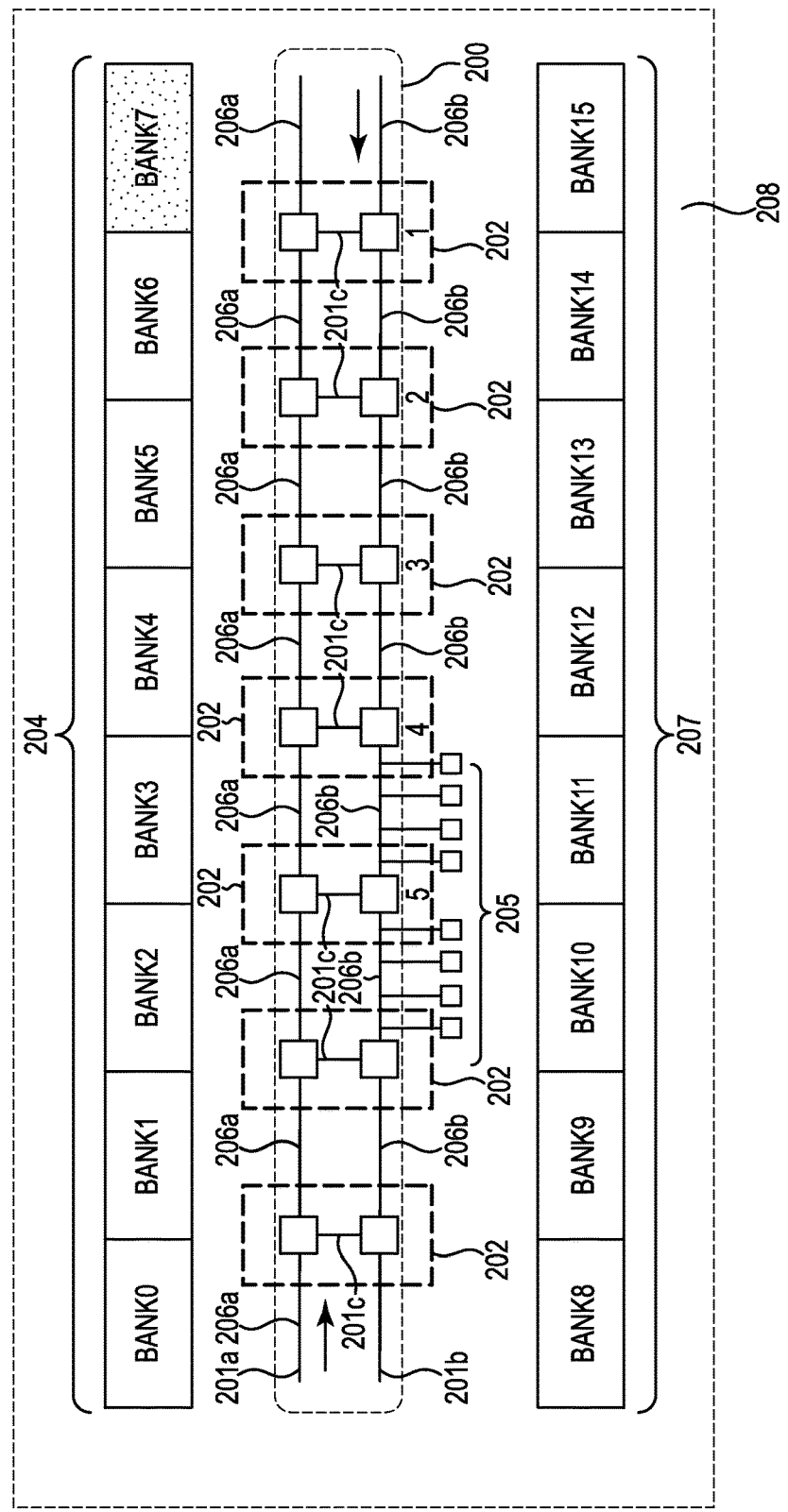
FIG. 2 is a schematic diagram indicative of a first embodiment of configuration of data buses transferring data from memory banks to data terminals with switching buffers.

FIG. 2 illustrates a switching buffer unit 200 according to an embodiment of the invention. The switching buffer unit 200 includes a data path, which includes a first data bus 201a, a second data bus 201b, and a plurality of third data busses 201c. The first data bus 201a includes data bus segments 206a and the second data bus 201b includes data bus segments 206b. The data path further includes switching buffer circuits 202 including the plurality of third data busses 201c that are coupled to the data bus segments of the first and second data busses 201a and 201b. Data terminals 205 are coupled to the second data bus 201b. Memory banks 204 and 207 may be coupled to the data path. The data busses 201a and 201b, and one of the plurality of third data busses in the switching buffer circuits 202 of the data path may be configured to transfer data from memory banks 204 to data terminals 205, as well as from the data terminals 205 to the memory banks 204 and 207. For example, the first data bus 201a and the second data bus 201b, each having a 64-bit data width, are arranged along a long side direction of a chip 208. With these data buses, 128(=64×2)-bit data can be transferred from or to the memory banks 204. Data on the first data bus 201a are transferred from a first side (e.g. left in FIG. 2) to a second side (e.g. right in FIG. 2) of the chip 208 and data on the second data bus 201b are transferred from the second side to the first side of the chip 208.

Each switching buffer circuit 202 includes a plurality of switching buffers, including a first switching buffer 203a provided on the first data bus 201a and a second switching buffer 203b provided on the second data bus 201b, and a third switching buffer (not shown in FIG. 2) on the one of the plurality of third data busses 201c. In this embodiment, the first switching buffers provided on the first data bus 201a are normally configured to drive data from a first data bus segment of the first data bus to a second data bus segment of the first data bus. The second switching buffers provided on the second data bus 201b are normally configured to drive data from a first data bus segment of the second data bus to a second data bus segment of the second data bus. Depending on a memory bank from which the data is transferred, any of the switching buffer circuits 202 may activate the third switching buffer on the one of the plurality of third data busses 201c, which is later described, in response to the memory bank and the third switching buffer drives data from the first data bus 201a to the second data bus 201b via the one of the plurality of third data busses 201c. For instance, one variation illustrated in FIG. 2 represents that data is transferred from Bank7, the third switching buffer in the switching buffer circuit 202 indicated with "1" is controlled to drive data from the first data bus 20a to the second data bus 201b via the one of the plurality of third data busses 201c, and then the second switching buffers (indicated with "2," "3," "4," and "5") on the second data bus 201b drive the data from one data bus segment 206b to another. As a result, data is transferred from Bank7 to the data terminals 205 via a data path route including six data bus segments and five switching buffer circuits. In this manner, a data path route of the data from a selected memory bank to data terminals 205 can be controlled.

Figure 3:
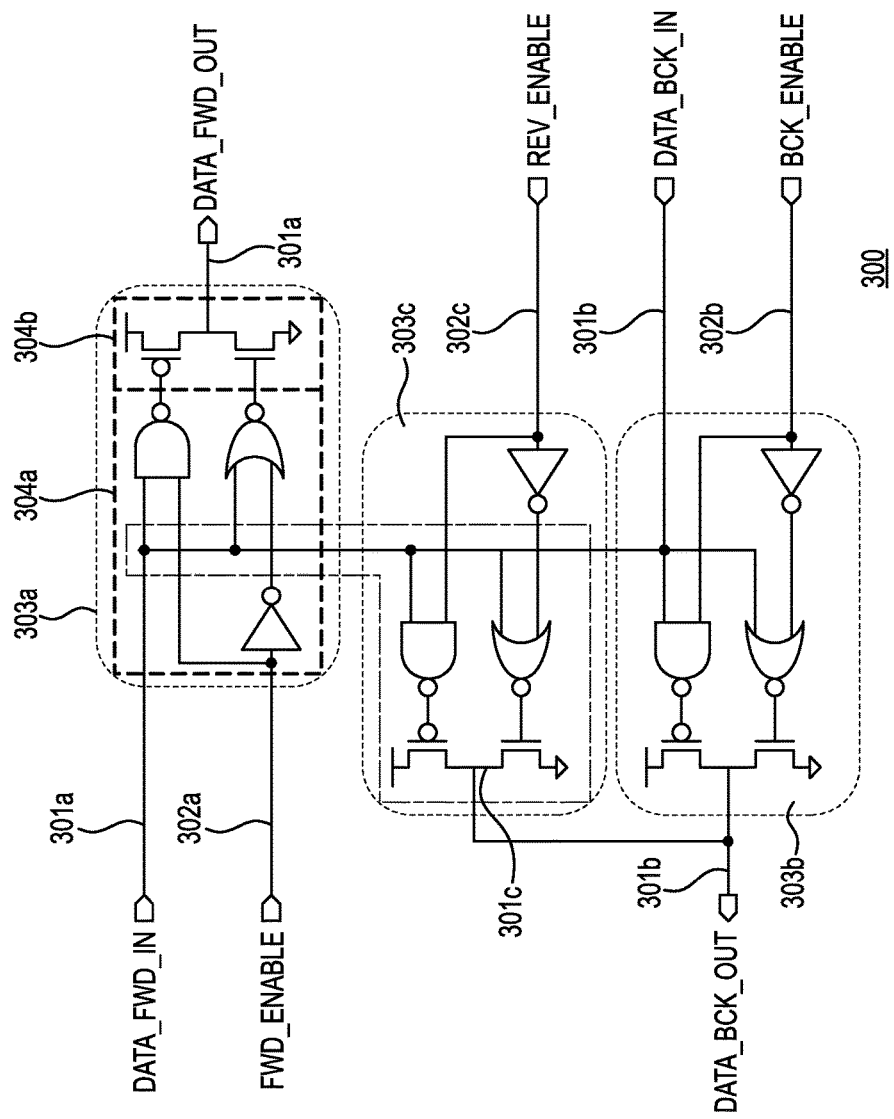
FIG. 3 is a circuit diagram indicative of a switching buffer circuit in the first embodiment.

FIG. 3 is a sample circuit diagram illustrative a switching buffer circuit 202 in FIG. 2 according to an embodiment of the invention. A switching buffer circuit 300 includes a plurality of switching buffers, such as a first switching buffer 303a (which may also be referred to as a "forward switching buffer") provided on the first data bus 301a (which may also be referred to as a "forward data bus"), a second switching buffer 303b (which may also be referred to as a "backward switching buffer") provided on the second data bus 301b (which may also be referred to as a "backward data bus"), and a third switching buffer 303c (which may also be referred to as a "bypass switching buffer") on the third data bus 301c (which may also be referred to as a "bypass data bus"). The first switching buffer 303a is configured to drive data from a first data bus segment of the first data bus 301a to a second data bus segment of the first data bus 301a, responsive to a "fwd_enable (Fwd_en)" signal 302a from the switch control circuit 14 of FIG. 1. In the embodiment illustrated in FIG. 3, the movement of data by the switching buffer 303a is from the left side to the right side of the switching buffer 303a. The first switching buffer 303a includes an input stage 304a and an output stage 304b.

In an operation when the first switching buffer 303a is controlled to drive data forward on the first data bus, an active "fwd_enable (Fwd_en)" signal 302a (e.g., logic high) is received at an inverter of the input stage 304a. A NAND logic and a NOR logic receive a "Data_fwd_in" data signal on the first data bus segment of the first data bus 301a and the NAND logic receives the "fwd_enable (Fwd_en)" signal 302a. The NOR logic receives the inverted "fwd_enable (Fwd_en)" signal, and the NAND logic and the NOR logic both output inverted data. In the output stage 304b, the outputs from the NAND logic and the NOR logic, both of which are inverted data as previously described, are received at a gate of a p-channel field effect transistor pFET and a gate of an n-channel field effect transistor nFET, respectively. The outputs are inverted back to the original data by the pFET and nFET to provide an output "Data_fwd_out" signal on the first data bus 301a. The "Data_fwd_out" signal may be provided to the second data bus segment.

Alternatively, in another operation when the first switching buffer 303a is not controlled to drive data forward, an inactive "fwd_enable (Fwd_en)" signal 302a (e.g., logic low), is received at the inverter at the input stage 304a. The NAND logic and the NOR logic receive the "Data_fwd_in" data signal on the first data bus segment of the first data bus 301a, and the NAND logic receives "fwd_enable (Fwd_en)" signal 302a whereas the NOR logic receives the inverted "fwd_enable (Fwd_en)" signal 302a, and the NAND logic and the NOR logic output logic high and logic low, respectively. In the output stage 304b, the logic high output from the NAND logic is received at a gate of a p-channel field effect transistor pFET and the logic low output from the NOR logic is received at a gate of an n-channel field effect transistor nFET. As a result, the "Data_fwd_in" data signal provided on the first bus segment is not provided as the output "Data_fwd_out" signal on the second bus segment of the first data bus 301a. Thus, the output stage 304b of the first switching buffer is disconnected from the signals of the input stage 304a.

Similarly, the second switching buffer 303b provided on the second data bus 301b is configured to drive data from a first data bus segment of the second data bus 301b to a second data bus segment of the second data bus 301b, responsive to a "bck_enable (Bck_en)" signal 302b from the switch control circuit 14 of FIG. 1. In the embodiment illustrated in FIG. 3, the movement of data by the switching buffer 303b is from the right side to the left side of the second switching buffer 303b. The third switching buffer 303c drives data from a data bus segment of the first data bus 301a to a data bus segment of the second data bus 301b via the third bus 301c, responsive to a "rev_enable (Rev_en)" signal 302c from the switch control circuit 14 of FIG. 1. As mentioned earlier, depending on a memory bank from which the data is transferred, the switching buffer circuit 300 receives any of the control signals, such as "fwd_enable (Fwd_en)" signal 302a, "bck_enable (Bck_en)" signal 302b and "rev_enable (Rev_en)" signal 302c, to move data from one data bus segment to another data bus segment. Which of the control signals is active as generated and transmitted from the switch control circuit 14 of FIG. 1, may be based on the memory bank selected (as indicated by a bank address signal BADD). Based on these control signals, the switching buffer circuit 300 may activate any of the switching buffers 303a, 303b and 303c.

FIGS. 4(a)-(h) includes schematic diagrams illustrating further example operation of the switching buffer unit 200 (FIG. 2) for transferring data from memory bank 204 to data terminals 205 through the data busses 201a and 201b and the switching buffer circuits 202 of the data path. FIGS. 4(a)-(h) illustrate only memory bank 204 for the sake of simplifying the drawings, however, those of ordinary skill in the art will appreciate that operation for transferring data from memory bank 207 to data terminals 205 would be similar as described for memory bank 204.

FIG. 4(a) shows that data is transferred from Bank0 of memory bank 204 to data terminals on a data path route. In this example operation, data provided by Bank0 passes through three switching buffers (indicated by "1," "2,", and "3") coupled to the first data bus 201a from the left side to the right side before being driven from the first data bus to the second data bus at a fourth switching buffer (indicated by "4") between Bank3 and Bank4 on the data path route. The data is moved through the three switching buffers from Bank0 by providing active "fwd_enable" signals to control the first switching buffers of the switching buffer circuits that include the three switching buffers. The data is moved through the fourth switching buffer on the data path route from the first data bus to the second data bus by providing an active "rev_enable" signal to the third switching buffer of the switching buffer circuit that includes the fourth switching buffer on the data path route. The data then passes through a fifth switching buffer (indicated by "5") on the data path route from the right side to the left side on the second data bus in order to be provided to the data terminals 205. The data is moved through the fifth switching buffer on the data path route by providing an active "bck_enable" signal to the second switching buffer of the switching buffer circuit including the fifth switching buffer.

As illustrated by the example of FIG. 4(a), the data path route for the data from Bank0 to the data terminals includes five switching buffers, which is the same number of switching buffers for the data path route for the data from Bank7 as shown in FIG. 2. As a result, the propagation delay of data transfer from Bank0 and the propagation delay of the data transfer from Bank7 can be substantially the same. FIGS. 4(b)-(h) show a similar result. That is, data may be transferred from the different banks through a respective data path route to the data terminals by passing through a similar number of switching buffers (e.g., the same number, one more, or one less). In particular, the data path routes for data from Bank1, Bank3 and Bank5 include four switching buffer circuits (FIGS. 4(b), 4(d), and 4(f)), and the data path routes for data from the other banks include five switching buffer circuits (FIGS. 4(a), 4(c), 4(e), 4(g), and 4(h)). Thus, the propagation delay from the different banks to the data terminals may be similar.

Because a switching buffer circuit between Bank0 and Bank1 is used for the data transfer from Bank0 in FIG. 4 (a), it is possible to include the first switching buffer without including the second and third switching buffers in the switching buffer circuit between Bank0 and Bank1. Similarly, a switching buffer circuit between Bank1 and Bank2 and a switching buffer circuit between Bank2 and Bank3 may include the first switching buffer without including the second and third switching buffers based on data transfers in FIGS. 4 (a)-(d), and a switching buffer circuit between Bank5 and Bank6 and a switching buffer circuit between Bank6 and Bank7 may include the second and third switching buffers without the first switching buffer based on data transfers in FIGS. 4 (e)-(h). In FIGS. 4(a)-(h), only the memory banks along the first data bus are shown; however another configuration including additional memory banks along the second data bus may be possible in an actual chip as shown in FIG. 2. Data from the memory banks along the second data bus may be firstly coupled to the first data bus, and then transferred to the data terminals by way of the second data bus in the similar manner that data from the memory banks along the first data bus is transferred.

Figure 5:
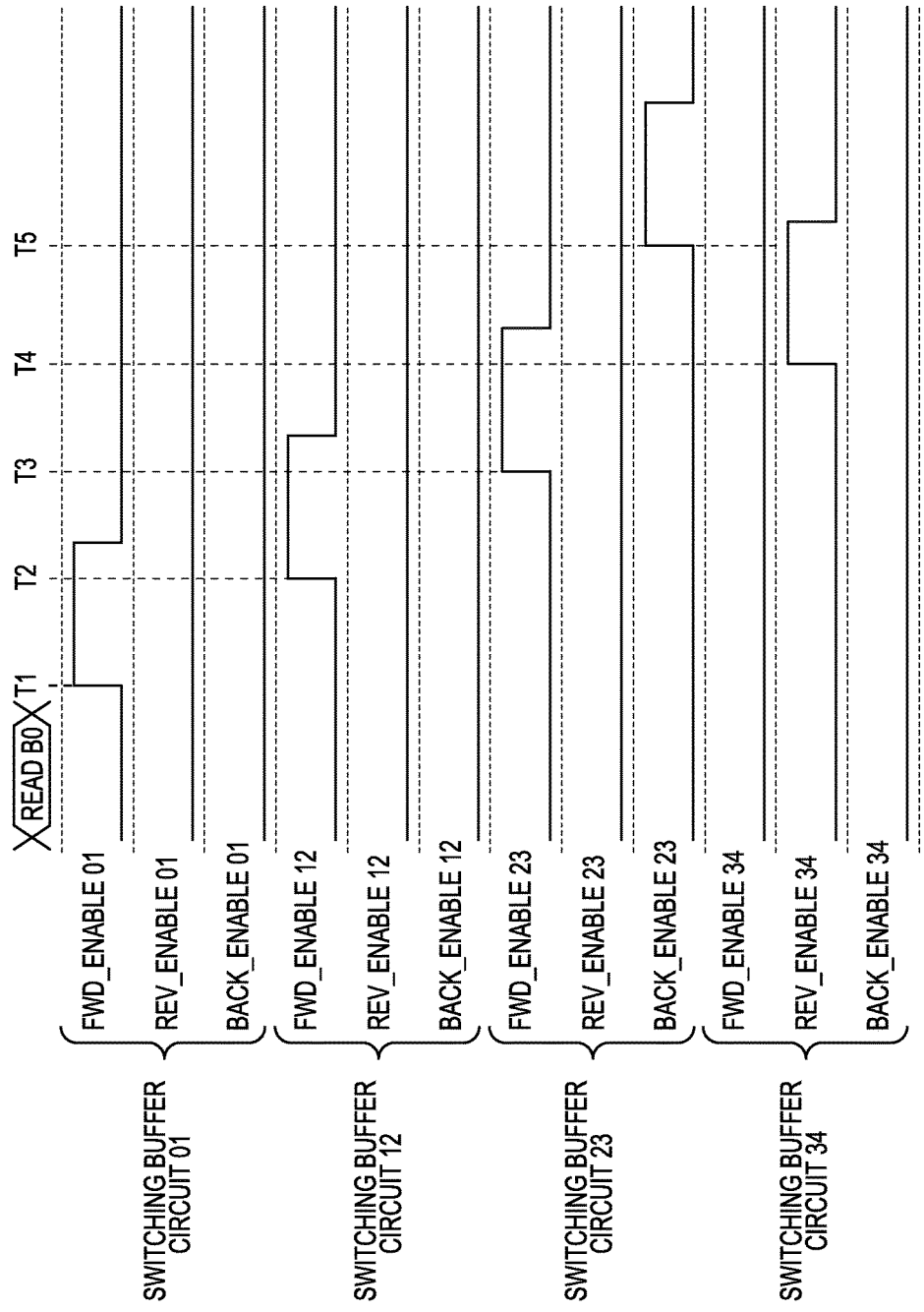
FIG. 5 is a timing chart for explaining read access operations of the first embodiment illustrated in FIG. 2.

FIG. 5 illustrates a timing diagram for explaining read access operations according to the first embodiment shown in FIG. 3. In particular, the timing diagram includes a configuration of enable signals provided by the switch control circuit to switching buffer circuits of FIG. 4(a), in order to adjust data transfer timings by switching a direction of data transfer. Before a time T1, data is read from Bank0. At the time T1 when the data is to be received by a switching buffer circuit 01 between Bank0 and Bank1, a logic high "fwd_enable 01" signal, which is a "fwd_enable (Fwd_en)" signal for the switching buffer circuit 01, is also received by the switching buffer circuit 01. Based on this logic high "fwd_enable 01" signal, the switching buffer circuit 01 drives its first switching buffer for the data such that the data is continued to be transferred on the first data bus. The "fwd_enable 01" signal is kept logic high until a certain time past T2 in order to ensure completion of the data transfer. Thus, there is some overlapped time of activation between adjacent two switching buffer circuits, such as the switching buffer circuit 01 and a switching buffer circuit 12, for the certain time past T2. Similarly, the switching buffer circuit 12 between Bank1 and Bank2 receives a logic high "fwd_enable 12" signal at the time T2 until time past a time T3 and continues to transfer the data on the first data bus. A switching buffer circuit 23 between Bank2 and Bank3 receives a logic high "fwd_enable 23" signal at the time T3 until past a time T4 and transfers the data on the first data bus. At the time T4, a switching buffer circuit 34 receives a logic high "rev_enable 34" signal, which is a "rev_enable (Rev_en)" signal for the switching buffer circuit 34. In response to the logic high "rev_enable 34" signal, the switching buffer circuit 34 activates its third switching buffer in order to bypass the data from the first data bus to the second data bus. At a time T5, the switching buffer 23 receives a logic high "back_enable 23", that is a "bck_enable (Bck_en)" signal for the switching buffer circuit 23, until past a time T6 and activates its second switching buffer in order to transfer the data on the second data bus. Thus the data is transferred to the data terminals. Similarly, for other variations, control signals such as a "fwd_enable (Fwd_en)" signal, a "bck_enable (Bck_en)" signal and a "rev_enable (Rev_en)" signal for each switching buffer circuit are provided by the switching control circuit according to selections and activation timings of switching buffers based on the bank address signal and the column command signal indicative of operations such as read/write, etc. The switching buffer circuits receive the control signals according to the selections and the activation timings of switching buffers, and activate the selected switching buffers at the activation timings, responsive to the control signal. Thus, the switching buffer circuits transmit the data from a selected memory bank to the data terminals.

Figure 6:
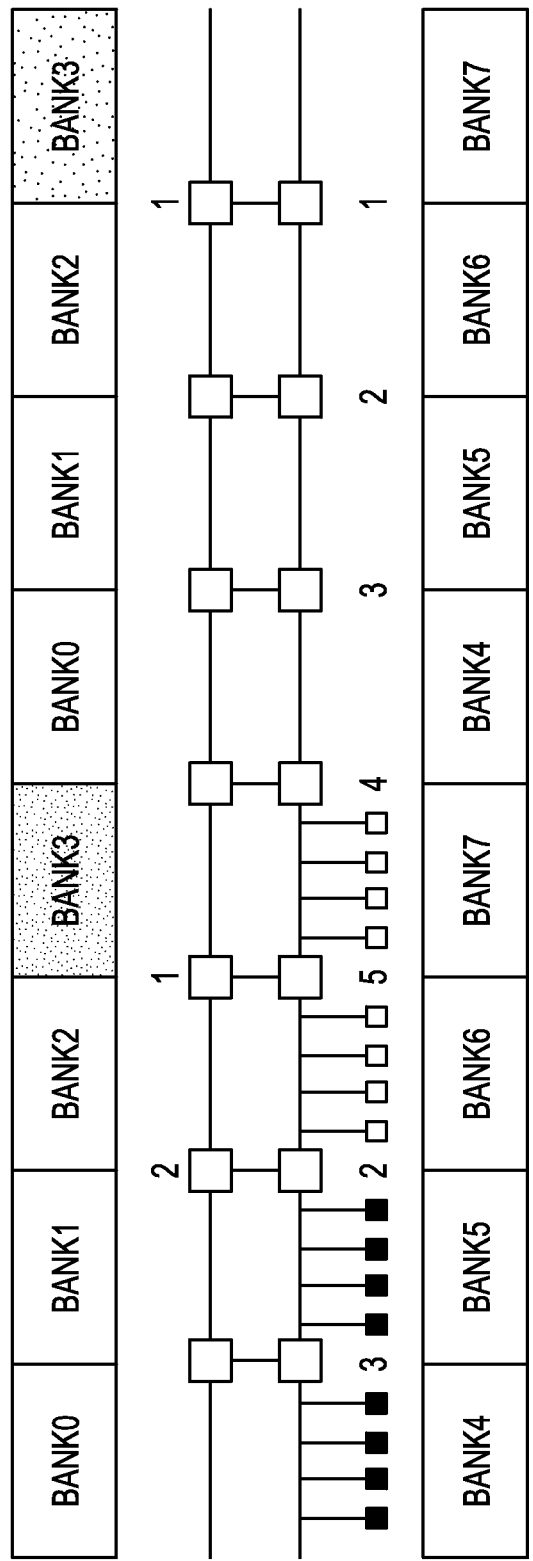
FIGS. 6 and 7(a)-(d) include schematic diagrams indicative of a second embodiment of configuration of data buses transferring data from memory banks to data terminals with switching buffers.

FIG. 6 is another example for an IO×16 configuration. In this case, regarding memory banks provided in a first half area of a chip, such as a left side in FIG. 6, data passes through two or three switching buffers, and regarding other memory banks provided in a second half area of the chip, such as a right side in FIG. 6, data passes through four or five switching buffers. This means that there is a difference in data transmitting timings between the memory banks in the first half area and the other memory banks in the second half area. In this scenario, data collision does not occur because timings of using each data bus segment of the second data bus by the data transferred from the memory banks from the first half area of the chip and the data transferred from the memory banks from the second half area of the chip will be different due to different times to take from these memory banks from the data bus segment. Thus, this type of configuration is advantageous in avoidance of data collisions.

Figure 7A:
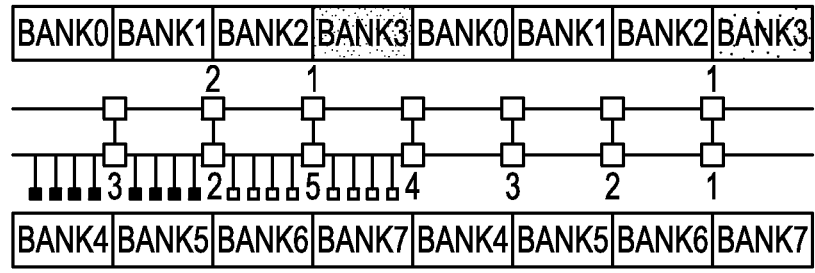

FIGS. 7(a)-(d) include schematic diagrams illustrating further example operations of the switching buffer unit in FIG. 6 for transferring data from memory banks to data terminals with switching buffers. For example, FIG. 7(a) shows that data are transferred from Bank3 and Bank7 to data terminals. In this variation, a first data from Bank3 passes through a switching buffer provided on the first data bus from the second side (e.g., right side) to the first side (e.g., left side) before being driven from the first data bus to the second data bus at a switching buffer circuit between Bank1 and Bank2 on a first path route. Once the data reaches the switching buffer circuit between Bank1 and Bank2, the data is moved from the first data bus to the second data bus by a third switching buffer of the switching buffer circuit between Bank1 and Bank2 The first data passes through another switching buffer from the second side to the first side on the second data bus to get to the data terminals on the first side. At the same time, a second data from Bank 7 is being driven from the first data bus to the second data bus at a switching buffer circuit between Bank6 and Bank7, and then driven from the second side to the first side on the second data bus to pass through four switching buffers to get to the data terminals on the first side.

Figure 7B:
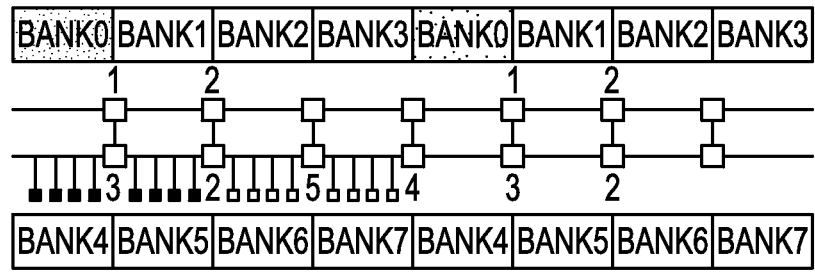
Figure 7C:
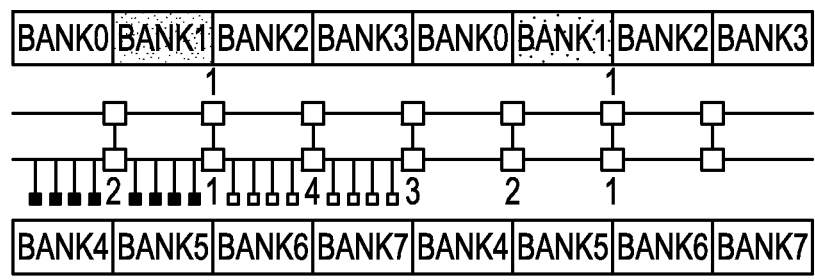
Figure 7D:
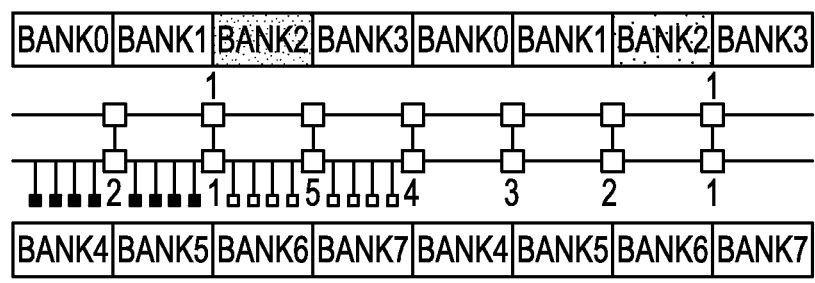

In FIG. 7(b), where the data are transferred from Bank0 and Bank4, the first data from Bank0 passes through one switching buffer provided on the first data bus from the first side to the second side and is transferred from the first data bus to the second data bus at a switching buffer circuit between Bank1 and Bank2 The first data then passes through one switching buffer from the second side to the first side on the second data bus and gets to the data terminals on the first side. In a meanwhile, a second data from Bank4 passes through one switching buffer provided on the first data bus from the first side to the second side and is transferred from the first data bus to the second data bus at a switching buffer circuit between Bank5 and Bank6. The second data is then driven from the second side to the first side on the second data bus to pass through three switching buffers to get to the data terminals on the first side. Similarly, the first data from Bank1 passes through a total of two switching buffers and the second data from Bank5 passes through a total of four switching buffers in FIG. 7(c), whereas the first data from Bank2 passes through a total of two switching buffers and the second data from Bank6 passes through a total of five switching buffers in FIG. 7(d). As a result, a number of switching buffers on a data path route for the first data from Bank0-3 are adjusted to about two or three and a number of switching buffers on a data path route for the second data from Bank4-7 are adjusted to about four or five. Thus, the durations of data transfer for the first data or the second data can be adjusted substantially the same. In FIGS. 7(a)-(d), only the memory banks along the first data bus are shown;

however another configuration including additional memory banks along the second data bus may be possible in an actual chip as shown in FIG. 6.

For driving the data from the first data bus to the second data bus, data transfers from Bank0-3 use a third switching buffer of the switching buffer circuit between Bank1 and Bank2 and data transfers from Bank4-7 use either a third switching buffer of a switching buffer circuit between Bank5 and Bank6 or a third switching buffer of a switching buffer circuit between Bank6 and Bank7. In some embodiments, a number of switching buffers in the switching buffer unit may be optimized by omitting a third switching buffer for the other switching buffer circuits.

FIGS. 8(a)-(h) include schematic diagrams illustrating another embodiment of the configuration of data buses. In the embodiment of FIGS. 8(a)-(h), data is transferred from memory banks to data terminals with switching buffers while varying directions of data transfer in a manner that a number of switching buffers on a data path route is exactly the same in order to have data transfer times (e.g., due to data path propagation delay) substantially the same. For example, in order to transmit data from Bank1 to the data terminals, each data bus in a configuration in FIG. 4(b) has one data transfer direction, and it is impossible to transmit the data from Bank1 to the data terminals passing through exactly five switching buffers. On the other hand, if the direction of data transfer according to the data's origin bank were changeable, it is possible to adjust the number of switching buffers on the data path route. In FIG. 8(b), when the data is read from Bank1, the data passes through a switching buffer provided on the first data bus from the second side to the first side, is driven from the first data bus to the second data bus at a switching buffer circuit on an end of the first side of Bank0, and passes through three switching buffers from the first side to the second side on the second data bus to get to the data terminals. Thus, the number of switching buffers from Bank1 to the data terminals with the data path route becomes five. Similarly, in FIGS. 8(b), 8(d) and 8(f) while reading data from Bank0, where 0 is an odd number less than seven, the number of switching buffers on each data path route can be set constant by changing the direction of data transfer, as the number of switching buffers on the data path route for the data from other memory banks.

Figure 9A:
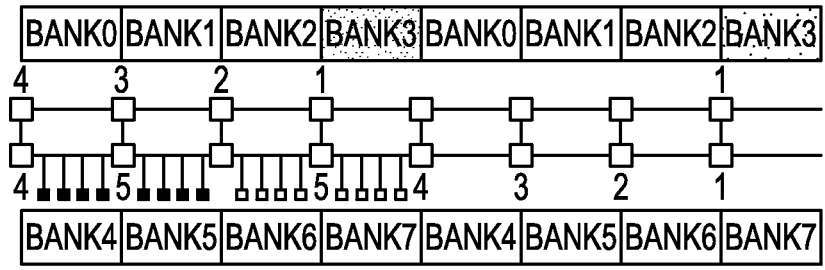
Figure 9B:
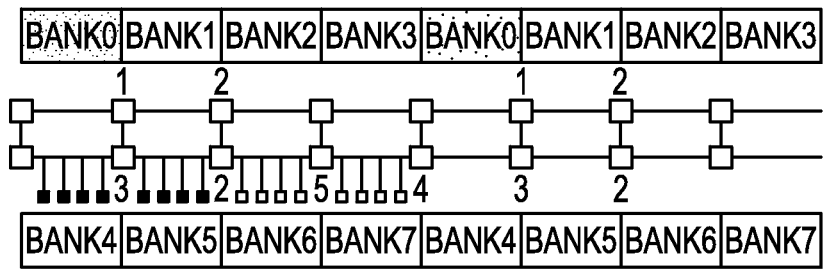
Figure 9C:
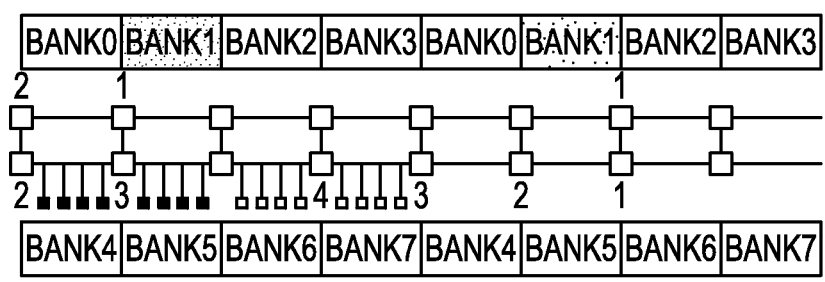
Figure 9D:
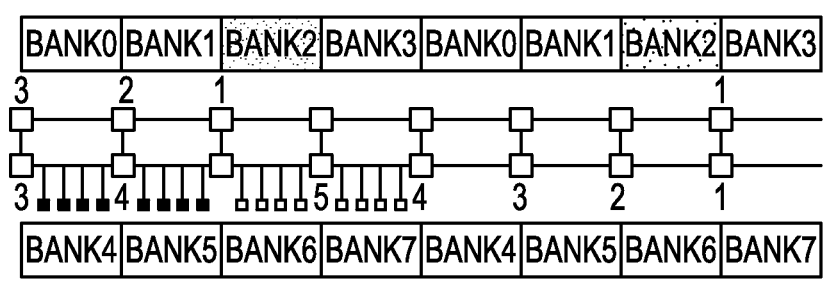

FIGS. 9(a)-(d) include schematic diagrams illustrating another embodiment of configuration of data buses, transferring data from memory banks to data terminals with switching buffers in an IO×16 configuration, while assigning different directions of data transfer between memory banks of the first side and memory banks of the second side. In the embodiment of FIGS. 9(a)-(d), data is transferred from memory banks to data terminals with switching buffers while varying directions of data transfer in a manner that numbers of switching buffers on two data path routes are as close as possible in order to have data transfer times (e.g., due to data path propagation delay) as close as possible. In FIG. 9(a), when the data are read from Bank3, the data provided in a first half area of a chip, such as a left side in FIG. 9 passes through three switching buffers provided on the first data bus from the second side to the first side, is driven from the first data bus to the second data bus at a switching buffer circuit on an end of the first side of Bank0, and passes through one switching buffer from the first side to the second side on the second data bus to get to the data terminals. In FIG. 9(b), while reading data from Bank0, the data passes through the first data bus from the first side to the second side, is driven from the first data bus to the second data bus at a switching buffer circuit on the second side of Bank1, and passes through one switching buffer from the second side to the first side on the second data bus to get to the data terminals. In FIGS. 9(c) and 9(d) while reading data from Bank1-2, the data pass through the first data bus from the second side to the first side, are driven from the first data bus to the second data bus at a switching buffer circuit on the first side of Bank0, and pass through one switching buffer from the first side to the second side on the second data bus to get to the data terminals. Thus, the numbers of switching buffers on two data path routes on the both half areas of the chip are controlled as close as possible in order to have data transfer times (e.g., due to data path propagation delay) as close as possible.

In order to change the direction of data transfer as shown in FIGS. 8(a)-(h) and 9(a)-(d), the switching buffer circuit may include additional switch, buffer, such as a bi-directional buffer, or control line for controlling the change of the direction of data transfer for reading the data from Bank0, different from the direction of data transfer for reading from the data from other memory banks, which may also be based on the bank address BADD signal. Additionally, different combinations of control signals, such as two or more control signals having set active (e.g. logic high), can be assigned to indicate reverse directions and interpreted by a decoder in each switching buffer circuit to generate reverse direction enable signals so that there is no extra control signal line to be added. Thus, this configuration enables to adjust the number of switching buffers on the data path route from an origin bank to the data terminals to five, for example, in IO×8 configuration.

Figure 10A:
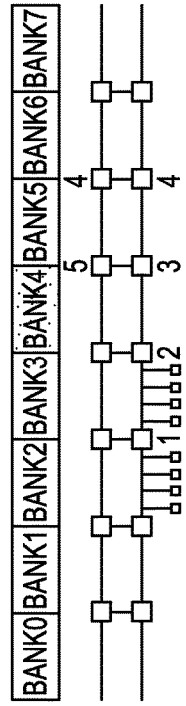
FIGS. 10(a)-(h) include schematic diagrams indicative of a fourth embodiment of configuration of data buses transferring data from data terminals to memory banks with switching buffers.
Figure 10B:
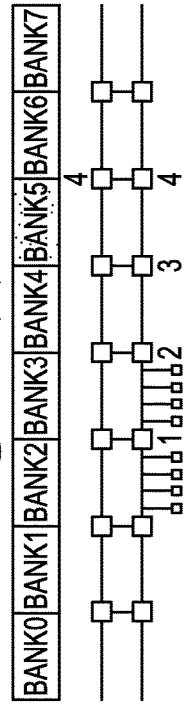
Figure 10C:
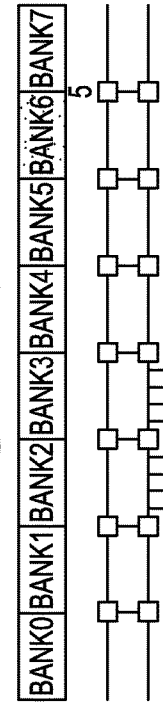
Figure 10D:
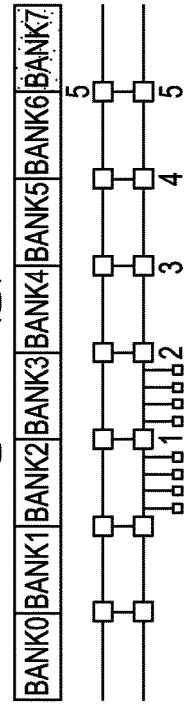
Figure 10E:
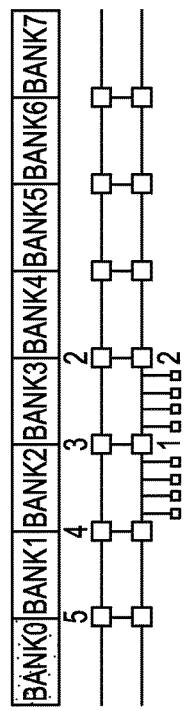
Figure 10F:
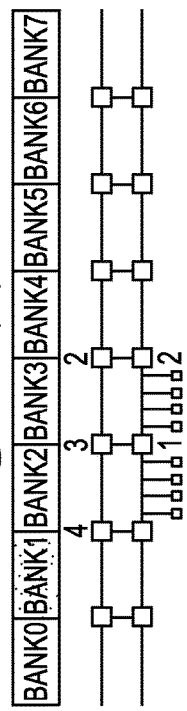
Figure 10G:
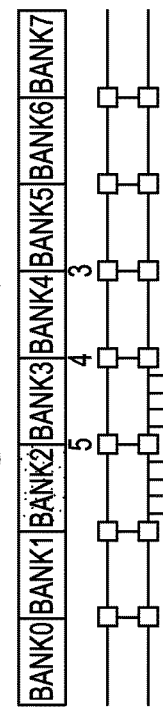
Figure 10H:
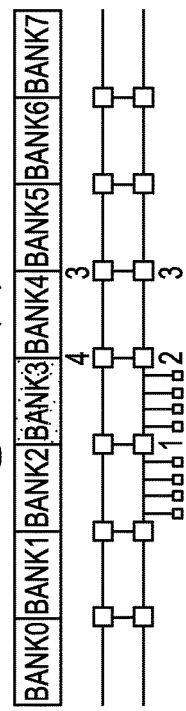

In a write operation, the similar effect of adjusting a number of switching buffers on a data path route can be achieved by reversing a direction of data transfer. Based on the bank address signal and the column command signal indicative of write operation, control signals are provided to switching buffer circuits on a switching buffer unit and cause data transfer of the write operation in a reverse direction opposite to the direction of data transfer of the read operation. FIGS. 10(a)-(h) include schematic diagrams illustrating another embodiment of configuration of data buses transferring data from data terminals to memory banks with switching buffers. For example, FIG. 10(a) shows that data is transferred from data terminals to Bank0 on a data path route. As shown in FIG. 10(a), data from the data terminals passes through one switching buffer on the second data bus from the first side to the second side, and is then driven from the second data bus to the first data bus by another switching buffer on the data path route (which is the third switching buffer of a switching buffer circuit between Bank3 and Bank4). The data is further driven from the second side to the first side on the first data bus, and then passes through three switching buffers to get to Bank0. As a result, a number of switching buffers on a data path route for the data to Bank0 becomes five. FIGS. 10(b)-(h) show a similar result, where data transferred from the data terminals to the memory banks pass through four or five switching buffer circuits, thus the durations of data transfer can be adjusted substantially the same. In FIGS. 10(b)-(h), only the memory banks along the first data bus are shown; however another configuration including additional memory banks along the second data bus may be possible in an actual chip as examples of read operations. Data from the data terminals is transferred to by way of the second data bus, firstly driven to the first data bus, transferred through switching buffers on the first data bus in the similar manner that data to the memory banks along the first data bus is transferred, and then coupled to the second data bus and transferred to memory banks along the second data bus.

As stated earlier referring to FIGS. 8(a)-(h) and 9(a)-(d), in order to change the direction of data transfer as shown in FIG. 10(a)-(h), the switching buffer circuit may include additional switch, buffer or control line for controlling the change of the direction of data transfer for reading the data which may also be based on the column command signal indicative of the write operation. Additionally, different combinations of control signals, such as two or more control signals having set logic high, can be assigned to indicate reverse directions and interpreted by a decoder in each switching buffer circuit to generate reverse direction enable signals so that a number of control signal lines does not have to increase. Thus, this configuration enables to adjust the number of switching buffers on the data path route from the data terminals to an origin bank to five, for example, in IO×8 configuration.

Figure 11:
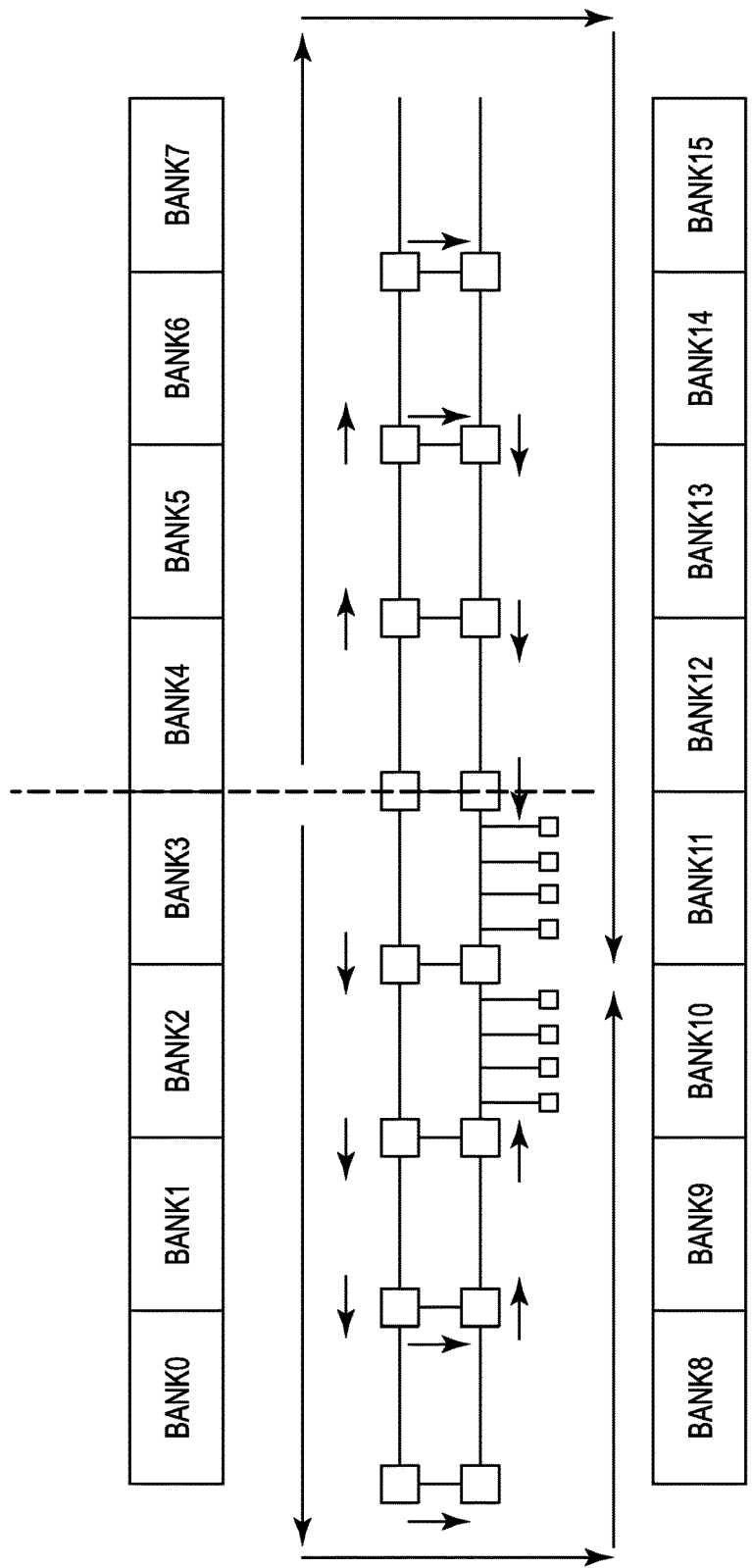
FIGS. 11 and 12(a)-(h) include schematic diagrams indicative of a fifth embodiment of configuration of data buses transferring data from memory banks to data terminals with switching buffers.
Figure 12A:
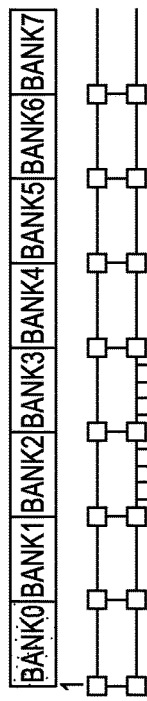
Figure 12B:
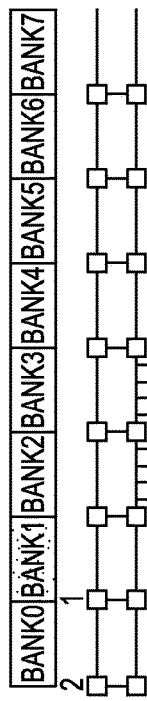
Figure 12C:
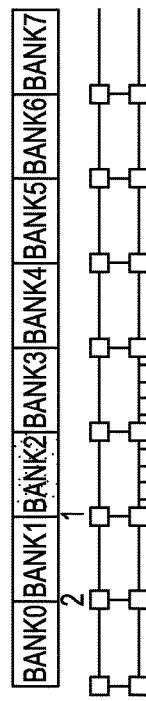
Figure 12D:
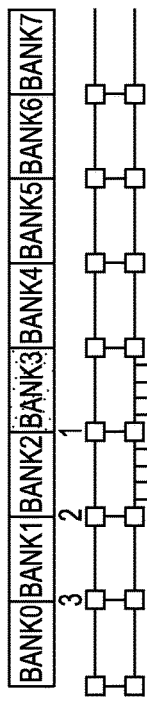
Figure 12E:
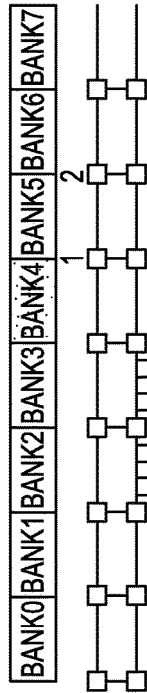
Figure 12F:
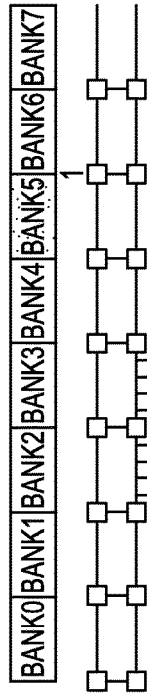
Figure 12G:
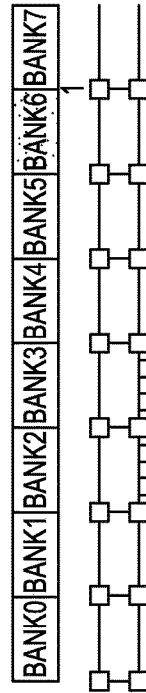
Figure 12H:
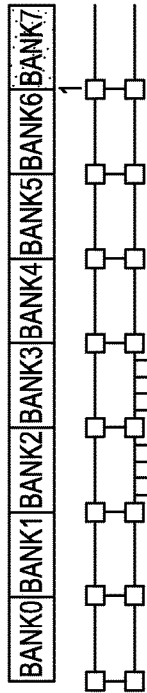

Depending on timing specification of each control signals and data signals, particularly on a relationship between timings of continuous column command in a column command signal and data transfer speed of a semiconductor device, the data collision may occur, especially if data transfer directions are varied. In order to avoid such data collision, another embodiment is proposed. FIG. 11 illustrates a switching buffer unit of the embodiment of configuration of data buses transferring data from memory banks to data terminals via switching buffers configured in a manner that each data bus segment has one way direction of data transfer. By configuring each data bus segment having one way direction of data transfer, data collision can be avoided between data transfer in a first operation and data transfer in a second operation immediately following the first operation. For example, in FIG. 11, if the direction of data transfer is divided between Banks0-3 and Bank4-7 on the first data bus, switching buffer circuits, such as one on the first side of Bank0 and the other between Bank6 and Bank7 may have a third switching buffer for bypassing between two buses, switching buffer circuits between Bank0 and Bank1 and between Bank5 and Bank6 may have three switching buffers, switching buffer circuits between Bank1 and Bank2 and between Bank4 and Bank5 may have two switching buffers one on the first data bus and the other on the second data bus without the third switching buffer between the first and second data buses. Switching buffer circuits between Bank3 and Bank4 and between Bank2 and Bank3 may have one switching buffer from the second side to the first side for a read operation in this embodiment. In this manner, a data transfer direction for each data bus segment from memory banks to data terminals can be controlled.

FIGS. 12(a)-(h) include schematic diagrams illustrating further example operation of the switching buffer unit of FIG. 11. Based on a data transfer scheme of FIG. 11, data path routes for Bank0-7 shown in FIGS. 12(a)-(h) include data bus segments, each having one direction. The read data from memory banks are transferred from the first data bus to the second data bus via one of four switching buffer circuits either on the first side or second end. As a result, the data immediately after read from memory banks is kept transferred on either the first data bus, third bus or data bus segments on the second data bus away from the data terminals, rather than driven immediately to the second data bus in a proximity of the data terminals. Thus, no data collision is caused by the recently read data with the previously read data on data bus segments on the second data bus approaching the data terminals, even if a series of column commands including read and write or other memory access command for one or more memory banks are issued consecutively. With this configuration having one data transfer direction for each data bus segment, it is still possible to achieve adjusting durations of data transfer substantially the same, as FIGS. 12(a)-(h) show that data transferred from the memory banks to the data terminals pass through four or five switching buffer circuits. In FIGS. 12(a)-(h), only the memory banks along the first data bus are shown; however another configuration including additional memory banks along the second data bus may be possible in an actual chip as shown in FIG. 11.

Figures 13A, 13B:
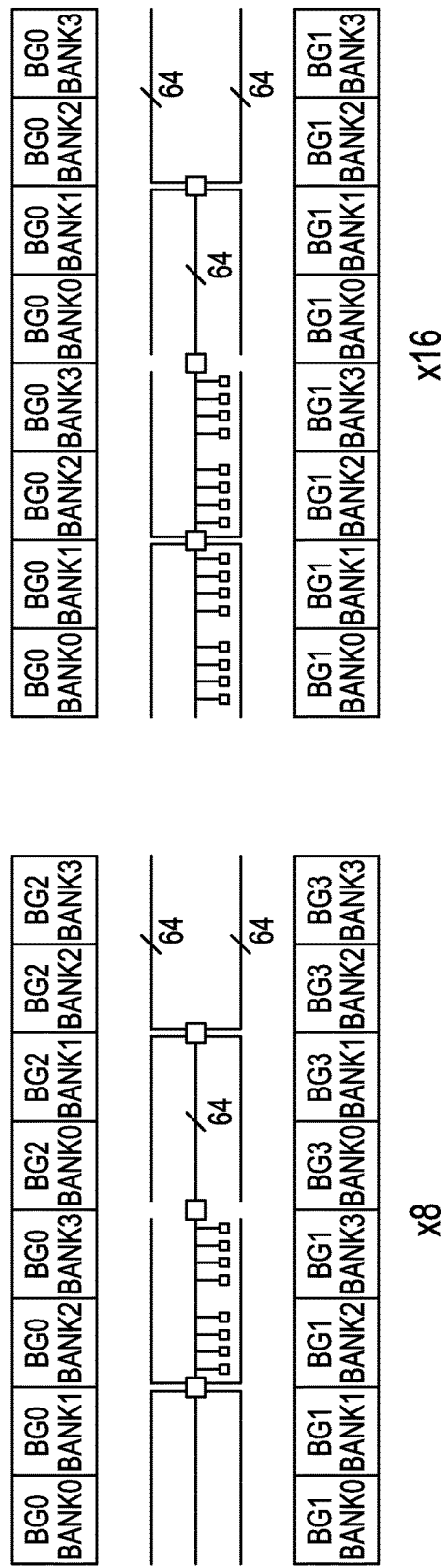
FIGS. 13(a) and 13(b) are schematic diagrams indicative of a fifth embodiment of configuration of data buses transferring data from memory banks to data terminals with switching buffers.

FIGS. 13(a) and 13(b) show example data bus configurations on a chip which have 192(=64×3)-bit data bus and in which distances between memory banks and corresponding data terminals are aligned to each other to align data transmitting timings among the memory banks FIG. 13(a) shows an example of an IO×8 configuration and data is transmitted between the eight data terminals and bank group BG0-3 each having four memory banks bank0-3. FIG. 13(b) shows an example of an IO×16 configuration, each of left half and right half portions of the chip includes two memory bank group BG0-1, the eight banks of the left half portion of the chip are coupled to eight data terminals arranged in the left side for data transferring, and the eight banks of the right half portion of the chip are coupled to eight data terminals arranged in the right side for data transferring.

Figures 14A, 14B:
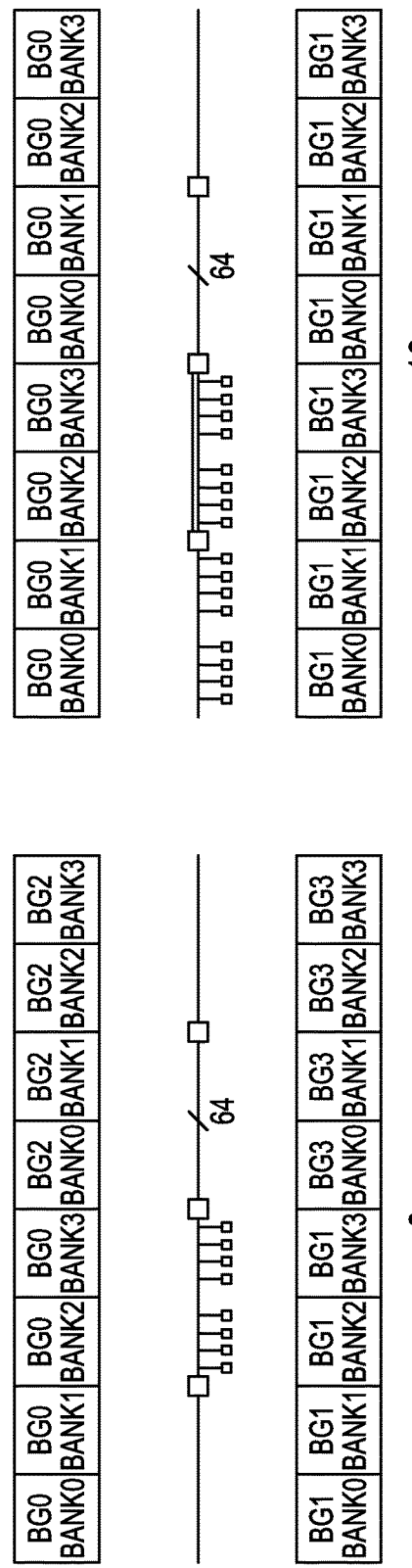
FIGS. 14(a) and 14(b) are schematic diagrams indicative of a sixth embodiment of configuration of data buses transferring data from memory banks to data terminals with switching buffers.

FIGS. 14(a) and 14(b) show other examples that include a minimum number of data buses on a chip. As described above, it may be difficult to achieve high speed data access while the number of data buses is minimized, because distances between the memory banks and the corresponding data terminals may be uncoordinated. As shown in FIG. 14(b), 128(=64×2)-bit data bus is used for distinguishing first data from/to the left half portion of the chip from second data from/to the right half portion of the chip.

According to various aspects of the present disclosure, timings of data transmission with a smaller number of data buses are adjusted among the memory banks by controlling directions of data transfer of each data bus segment on a data path route and adjusting a number of switching buffers on the data path route based on control signals based on bank addresses and column commands. This data bus transfer configuration based on the control signals thus controls propagation delays substantially the same for a plurality of banks and enables high speed data read and write operations.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:
1. An apparatus comprising:
one or more data terminals;
a plurality of memory banks, one of the plurality of memory banks being selected responsive, at least in part, to a bank address; and
a data path including a plurality of data path routes and a plurality of switching buffers on the plurality of data path routes, the plurality of switching buffers configured such that one or more of the plurality of switching buffers are selected responsive, at least in part, to the bank address and further configured to activate one of the plurality of data path routes, the data terminals being coupled to the one of the plurality of memory banks through the one of the plurality of data path routes;
wherein the data path includes a forward bus coupled to the plurality of memory banks and a backward bus coupled to the data terminals;
wherein the plurality of switching buffers further includes a plurality of forward switching buffers arranged on the forward bus and a plurality of backward switching buffers arranged on the backward bus.

2. The apparatus of claim 1, wherein the data path further includes a plurality of bypass buses each connected between a corresponding node of the forward bus and a corresponding node the backward bus, the plurality of switching buffers include one or more bypass switching buffers each arranged on a corresponding one of bypass buses.

3. The apparatus of claim 2, wherein the bypass switching buffers are configured such that a corresponding one of the bypass switching buffers on the corresponding bypass bus is turned on responsive, at least in part, to the bank address.

4. The apparatus of claim 1, wherein at least one of the plurality of switching buffers is a bi-directional buffer configured to switch a direction of data transfer of a corresponding bus.

5. An apparatus comprising:
one or more data terminals;
a plurality of memory banks, one of the plurality of memory banks being selected responsive, at least in part, to a bank address; and
a data path including a plurality of data path routes and a plurality of switching buffers on the plurality of data path routes, the plurality of switching buffers configured such that one or more of the plurality of switching buffers are selected responsive, at least in part, to the bank address and further configured to activate one of the plurality of data path routes, the data terminals being coupled to the one of the plurality of memory banks through the one of the plurality of data path routes;
wherein a first group of the plurality of switching buffers are configured to be turned on responsive, at least in part, to a first bank address signal and a second group of the plurality of switching buffers is configured to be turned on responsive, at least in part, to a second bank address signal; and
wherein the first group of the plurality of switching buffers includes first switching buffers configured to be turned on at different timings.

6. The apparatus of claim 5, wherein the first group of the plurality of switching buffers includes first switching buffers, the second group of the plurality of switching buffers including second switching buffers and a difference number between the first switching buffers and the second switching buffers is zero or one.

7. The apparatus of claim 5, wherein at least one of the plurality of switching buffers is a bi-directional buffer configured to switch a direction of data transfer of a corresponding bus.

8. A method of transmitting data, comprising:
   selecting a memory bank of a plurality of memory banks responsive, at least in part, to a bank address;
   selecting one or more switching buffers on a data path route of a plurality of switching buffers on a plurality of data path routes in a data path responsive, at least in part, to the bank address, wherein the data path route is configured to couple one or more data terminals to the selected memory bank;
   activating the data path route; and
   providing the data between the selected memory hank and the data terminals;
   wherein the data path includes a forward bus coupled to the plurality of memory banks and a backward bus coupled to the data terminals, and wherein the plurality of switching buffers further includes a plurality of forward switching buffers arranged on the forward bus and a plurality of backward switching buffers arranged on the backward bus.

9. The method of claim 8, wherein selecting the one or more switching buffers comprises:
   receiving control signals by the selected one or more switching buffers, wherein the control signals are based, at least in part, on the bank address and a memory access command, and
   wherein activating the data path route comprises:
      activating the one or more switching buffers responsive to the control signals.

10. The method of claim 9, wherein activating one or more switching buffers responsive to the control signals comprises:
    activating the selected one or more switching buffers to transfer data between the selected memory bank on a first bus and the data terminals on a second bus via one of a plurality of third buses each connected between a corresponding node of the first bus and a corresponding node the second bus.

11. The method of claim 9, wherein the memory access command includes a read command indicative of read operation and further includes a write command indicative of write operation, the method further comprising:
    controlling a direction of data transfer on the data bus routes by the one or more switching buffers responsive to the memory access command; and
    executing a read operation transferring the data from the selected memory bank to the data terminals responsive to the read command and executing a write operation transferring the data from the data terminals to the selected memory bank responsive to the write command.

12. The method of claim 8, wherein a number of switching buffers of the selected one or more switching buffers on each data path route of the plurality of data path routes in the data path is substantially the same among the plurality of memory banks.

13. The method of claim 8, wherein the plurality of memory banks comprises a first group of memory banks on a first side and a second group of memory banks on a second side, the first group and the second group located adjacent to each other at the second side of the first group and the first side of the second group, and wherein the first bus, the second bus, and the third bus comprise data bus segments between the plurality of switching buffers, the method further comprising:
    controlling directions of data transfer on the data bus segments by the plurality of switching buffers responsive to the memory access command;
    transferring the data from the first group of memory banks from the second side to the first side on the first bus, from the first bus to the second bus via the third bus on the first side, and from the first side to the second side on the second bus to the data terminal; and
    transferring the data from the second group of memory banks from the first side to the second side on the first bus, from the first bus to the second bus via the third bus on the second side, and from the second side to the first side on the second bus to the data terminals.

14. A method of transmitting data, comprising:
    selecting a memory bank of a plurality of memory banks responsive, at least in part, to a bank address;
    selecting one or more switching buffers on a data path route of a plurality of switching buffers on a plurality of data path routes in a data path responsive, at least in part, to the bank address, wherein the data path route is configured to couple one or more data terminals to the selected memory bank, and wherein selecting the one or more switching buffers comprises:
       receiving control signals by the selected one or more switching buffers, wherein the control signals are based, at least in part, on the bank address and a memory access command;
    activating the data path route by at least activating the one or more switching buffers responsive to the control signals, wherein activating the one or more switching buffers responsive to the control signals comprises:
       activating the selected one or more switching buffers to transfer data between the selected memory bank on a first bus and the data terminals on a second bus via one of a plurality of third buses each connected between a corresponding node of the first bus and a corresponding node the second bus; and
    providing the data between the selected memory bank and the data ten finals;
    wherein a number of the selected one or more switching buffers on the data path route is adjusted to be exactly the same among the plurality of memory banks by controlling a direction of data transfer on the first bus, the second bus and a third bus by the one or more switching buffers.

15. A memory apparatus comprising:
    a plurality of memory banks;
    data terminals;
    a switching buffer unit, comprising:
    a data path coupled to the data terminals and the plurality of memory banks, the data path including:
    a first data bus including a plurality of first data bus segments;
    a second data bus including a plurality of second data bus segments; and
    a plurality of third data busses;
    a plurality of switching buffer circuits configured to couple the data terminals to one of the plurality of memory banks associated with the bank address, each switching buffer circuit comprising:
    a first switching buffer on the first data bus configured to receive a first switch control signal and further configured to connect two adjacent first data bus segments responsive to the first switch control signal;

a second switching buffer on the second data bus configured to receive a second switch control signal and further configured to connect two adjacent second data bus segments responsive to the second switch control signal; and a third switching buffer on the corresponding third data bus configured receive a third switch control signal and further configured to connect the first data bus and the second data bus responsive to the third switch control signal; and a switch control circuit configured to receive a bank address signal indicative of a bank address to be selected among the plurality of memory banks, and to receive a column command signal, and further configured to provide the first, second, and third switch control signals responsive, at least in part, to the bank address signal and the column command signal.

16. The memory apparatus of claim 15, wherein the switch control circuit is configured to provide the switch control signals to the switching buffer circuits according to selection and activation timings of switching buffers responsive, at least in part, to the bank address signal and the column command signal, and wherein the switching buffer circuits are configured to receive the switch control signals based on the selected bank address, and to activate the a plurality of switching buffers based on the selection and activation timings.

17. The memory apparatus of claim 16, wherein a number of the plurality of switching buffers based on the selection is substantially the same among the plurality of memory banks.

18. The memory apparatus of claim 17, wherein the plurality of switching buffers comprises a plurality of bi-directional buffers configured to switch a direction of data transfer of a corresponding bus, and wherein the number of the plurality of switching buffers on the data path route is adjusted to be exactly the same among the plurality of memory banks by controlling a direction of data transfer on the first data bus, the second data bus and the third data bus by the plurality of bi-directional buffers.

19. The memory apparatus of claim 16, wherein the column command signal is associated, at least in part, with a memory access command including a read command indicative of read operation and further including a write command indicative of write operation, wherein a read operation is executed by transferring the data from the selected memory bank to the data terminals responsive to the read command and a write operation is executed by transferring the data from the data terminals to the selected memory bank responsive to the write command.

* * * * *